United States Patent [19]

Omori et al.

[11] Patent Number: 5,755,157
[45] Date of Patent: May 26, 1998

[54] SOLDER PASTE STENCIL PRINTER

[76] Inventors: Michael K. Omori, 511 Margie Pl., San Marcos, Calif. 92069; Floyd Gary Miller, 4977 Julie St., Livermore, Calif. 94550

[21] Appl. No.: 773,427
[22] Filed: Dec. 27, 1996
[51] Int. Cl.[6] .................................................. B41F 15/00
[52] U.S. Cl. ........................ 101/114; 101/127.1; 101/126; 118/213; 118/406
[58] Field of Search ............................... 101/114, 115, 101/123, 126, 127.1; 29/745; 118/213, 406

[56] References Cited

U.S. PATENT DOCUMENTS

| 894,891 | 8/1908 | Knapp et al. | 118/213 |
| 4,054,091 | 10/1977 | Bradley | 101/115 |

FOREIGN PATENT DOCUMENTS

| 0012649 | 1/1982 | Japan | 101/126 |

*Primary Examiner*—Christopher A. Bennett

[57] ABSTRACT

A solder paste stencil printing apparatus in which a stencil plate having a porous figure printing area may be used for single component solder paste application. The printing operation is performed by alignment of the stencil pattern figure over the appropriate component substrate pads. With the stencil plate being held in place by downward force, solder paste is dispensed over the stencil plate pattern allowing gravity flow of the paste material into the stencil pattern pores. Excess paste material is squeegeed level to the top surface of the stencil plate and the plate lifted from the substrate surface leaving solder paste in the configured pattern. An associated stencil plate holder matched to the printer head shaft allows any number of stencil plate patterns to be made available for solder paste application.

3 Claims, 6 Drawing Sheets

SOLDER PASTE STENCIL PRINTER

CROSS REFERENCES TO RELATED APPLICATIONS

Application for Solder Paste Stencil Printer. U.S. Pat. No. 5,107,759

BACKGROUND

1. Field of Invention

This invention relates to the single site stencil printing of solder paste onto a printed circuit board.

2. Description of Prior Art

In the conventional process of surface mount technology rework, prototyping, and research and development, exchange or replacement of single components is often encountered. Presently some of the common methods being used to apply solder for placing replacement components onto populated printed circuit boards include:

1. Use of existing solder to mount new component;
2. Deposit of a solder paste bead onto substrate pads;
3. Use of solder tape over substrate pads;
4. Surface tension transfer of solder onto substrate pads;
5. Dispensing of solder dots onto substrate pads Except for solder paste dot dispensing which requires costly equipment or if done manually is very tedious, the existing methods often exhibit placement inaccuracy, contamination and inconsistent paste volume from pad to pad resulting in problems in bridging and poor solder joints. It is therefore the object of this invention to provide a functionally simple, consistent, repeatable and economical method and apparatus for solder paste application in single component placement.

On Apr. 28, 1992, U.S. Pat. No. 5,107,759 was issued to Michael Omori and Floyd Gary Miller for a Solder Paste Stencil Printer. Since 1992, the two inventors have made certain improvements to the inventions that have proven to be superior to the original invention.

The original printer head has a plunging action lifting rod. The original stencil has a conforming pad that allowed it to adjust to minor imperfections in the levelness of the substrate surface. However, when the substrate surface is excessively angled out of perpendicular to the printer head, a ball joint proved to be more efficient in that allowed for easier conformity to the board surface. This required changing the head on the printer unit to include a ball joint which allowed easy manipulation onto angled surfaces. The inventors also found that the individual stencils could be improved. The inventors have improved the individual stencils to accommodate side mounting by including flip up sides. This patent is being submitted concurrently with the present improvement.

The apparatus utilizes a stencil mounting head with a ball joint attached to a pivot arm assembly providing easy visual alignment of the stencil plate and substrate pads. The new ball joint allows the operator even more precision in the alignment of the stencil plate. This alignment is maintained by downward biased spring force of the stencil head against the substrate surface allowing paste dispensing and squeegee procedures to be completed without disturbing the stencil alignment. The printing procedure is completed by the lifting of the stencil plate from the substrate surface leaving the solder paste precisely applied. Control and isolation of external movement during the critical lifting operation is accomplished by an internal central lifting rod operated by a flexible cable-mechanism. Various stencil patterns can be easily interchanged through the use of the associated stencil plate holder that slips onto the printer head shaft.

OBJECTS AND ADVANTAGES

Accordingly, several objects and advantages of our invention are to provide a functionally simple, consistent, repeatable and economical method and apparatus for solder paste application in single component placement processes. This invention is the same as the original in that it relates to a simple apparatus that enables available etched stencil plate and solder paste stenciling technology to be used in small and limited work production situations where commercial paste screening or stenciling is not viable.

Still further objects and advantages will become apparent from a consideration of the ensuing description and accompanying drawings.

Figure 1:
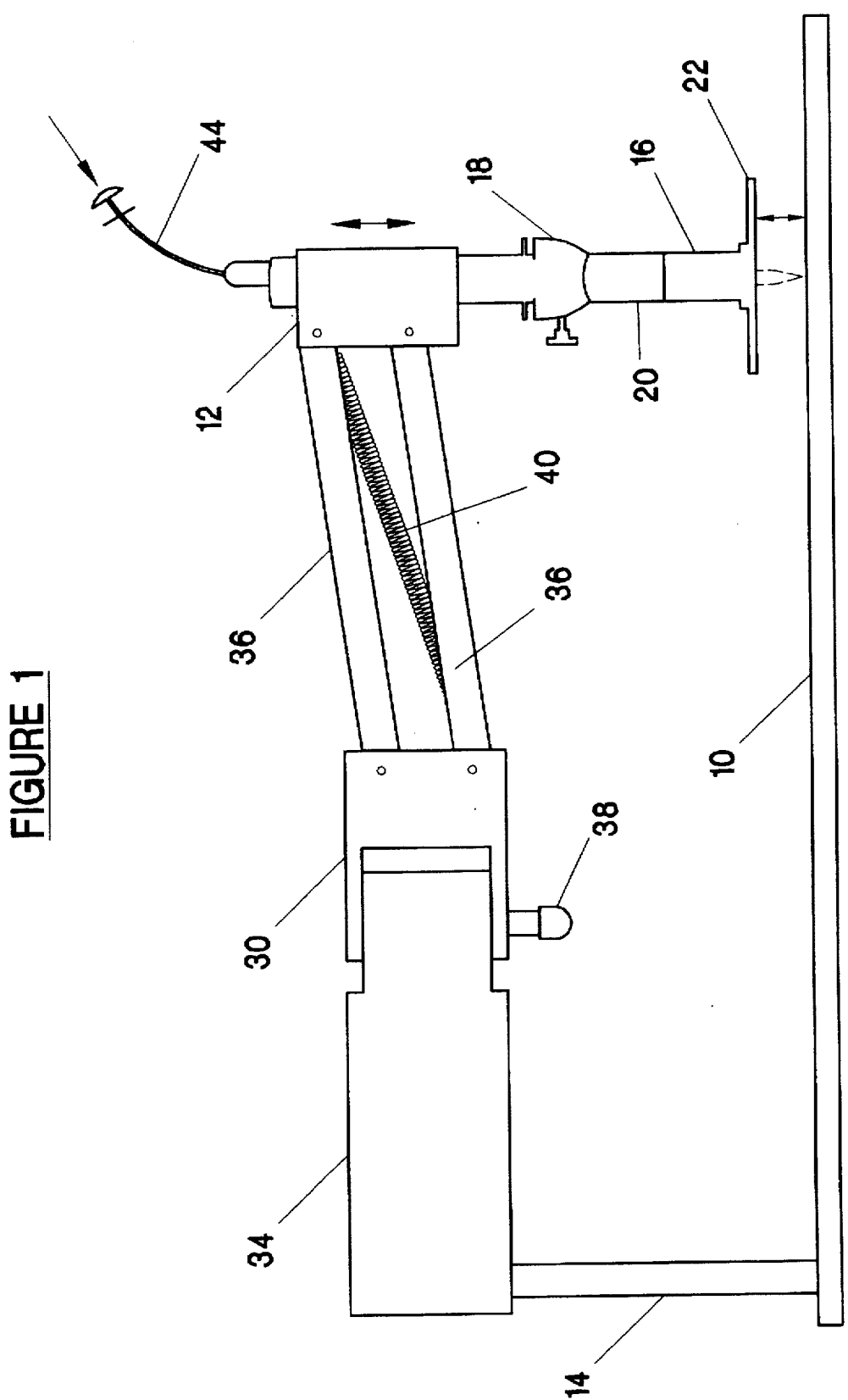
FIG. 1 shows the elevation of the stencil printer with a stencil holder installed in an operational condition. The dotted portion indicates the plunging action of the lifting rod, with arrows indicating the resulting direction of movement of the stencil head. The stencil is shown raised above the working surface by the action of the lifting rod.
Figure 2:
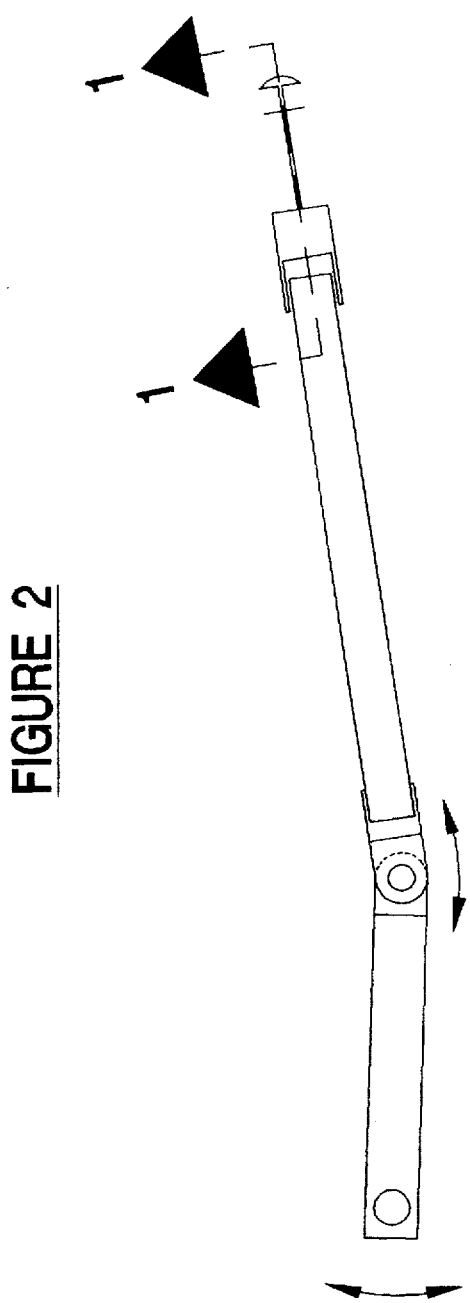
FIG. 2 is a plan view of the arm mechanism. The angular relationship of the mechanism parts was drawn to clarify the pivoting and hinge action of the assembly as indicated by the curved arrows.

REFERENCE NUMERALS 10 work plate
12 printer head
14 pivot post
16 stencil holder
18 ball joint
20 printer head shaft
22 stencil plate
24 aperture
26 lifting rod
30 hinge piece
32 ball clip
34 pivot arm
36 parallel arms system
38 hinge pin
40 tension spring
42 locking screw
44 cable release
46 shaft 48 step washer 50 conforming pad

SUMMARY

In accordance with this invention, an apparatus is provided for stencil printing solder paste for single component footprint patterns onto populated printed circuit assemblies.

Preferred Embodiment—Description

Referring to FIG. 1, the subject printed circuit assembly to be worked upon is placed conveniently on the work plate 10. It is only required that the area to be stenciled be within the physical working distance of the printer head 12 pivoting about the pivot post 14. The subject area thusly located, a stencil holder 16 with the desired stencil pattern is selected.

A ball joint 18 is located in the middle of the printer head shaft 20. The ball joint allows for greater flexibility to accommodate greater angular variations between the stencil holder 16 and substrate surface. The ball joint specifications are publicly available and therefore not further described. The centrally located aperture 24 in the stencil plate 22, is a key design element allowing thru passage of the lifting rod 26, FIG. 3.

Figure 3:
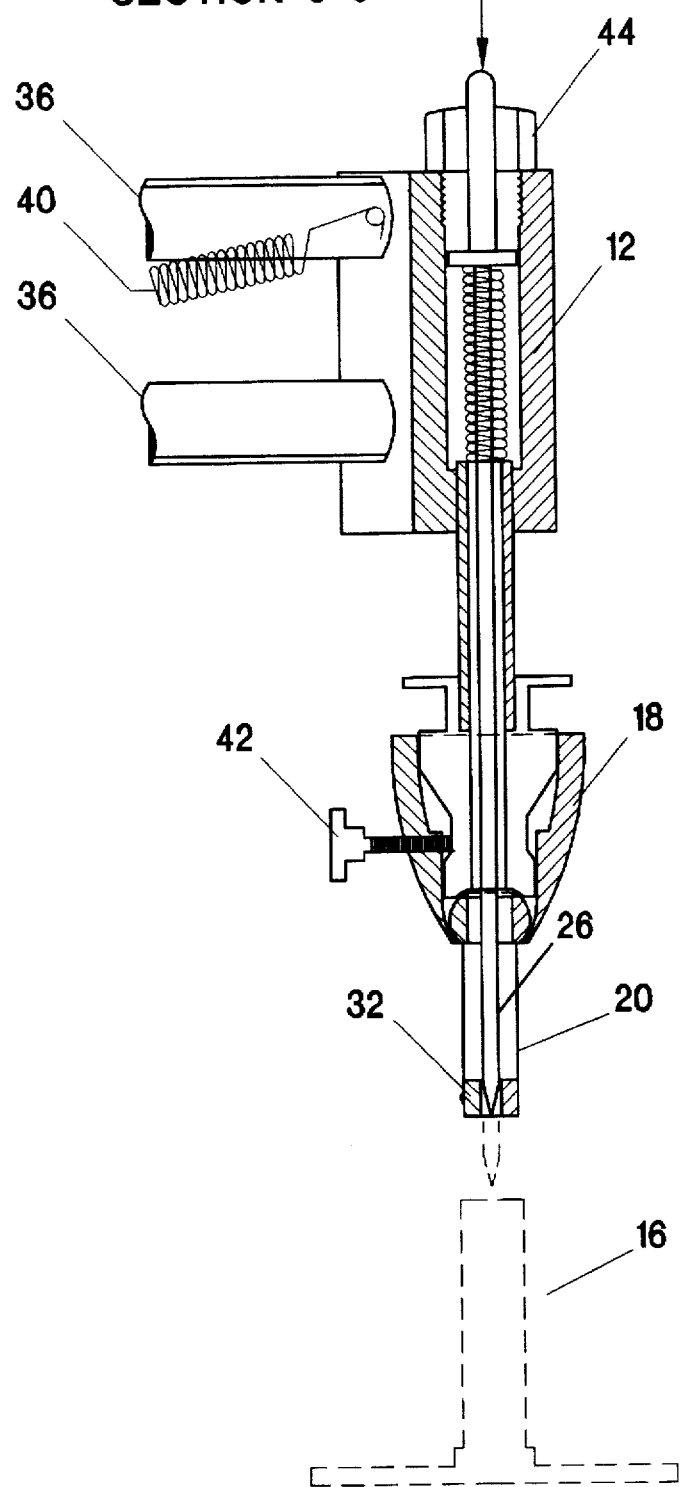
FIG. 3 shows the detailed cross section A—A, FIG. 2, of the printer head with the internal lifting rod mechanism. In dotted outline aligned with the printer head shaft-is a stencil holder, drawn to clarify the relationship and attachment of the stencil holder to the stencil printer.
Figure 4:
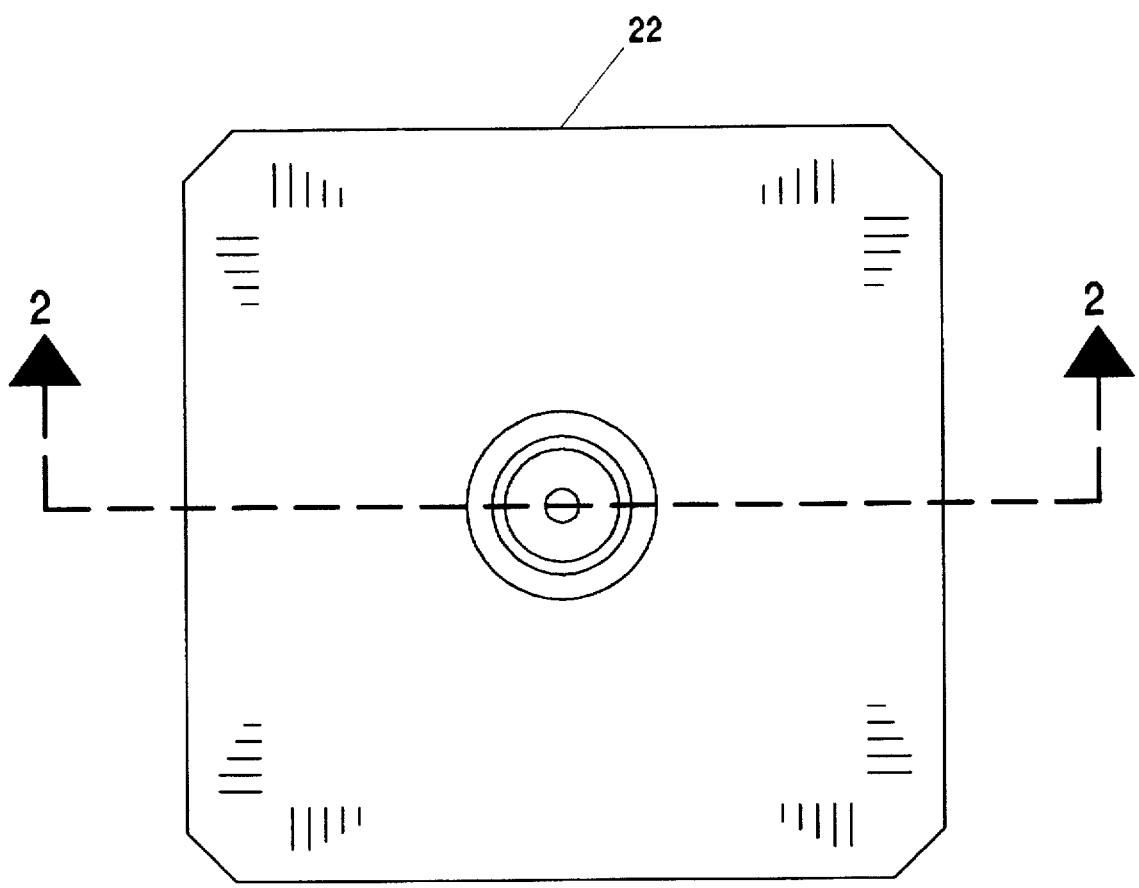
FIG. 4 is a plan view of the stencil holder and a stencil plate. The actual component footprint pattern is not significant to the invention and is not drawn in detail.
Figure 5:
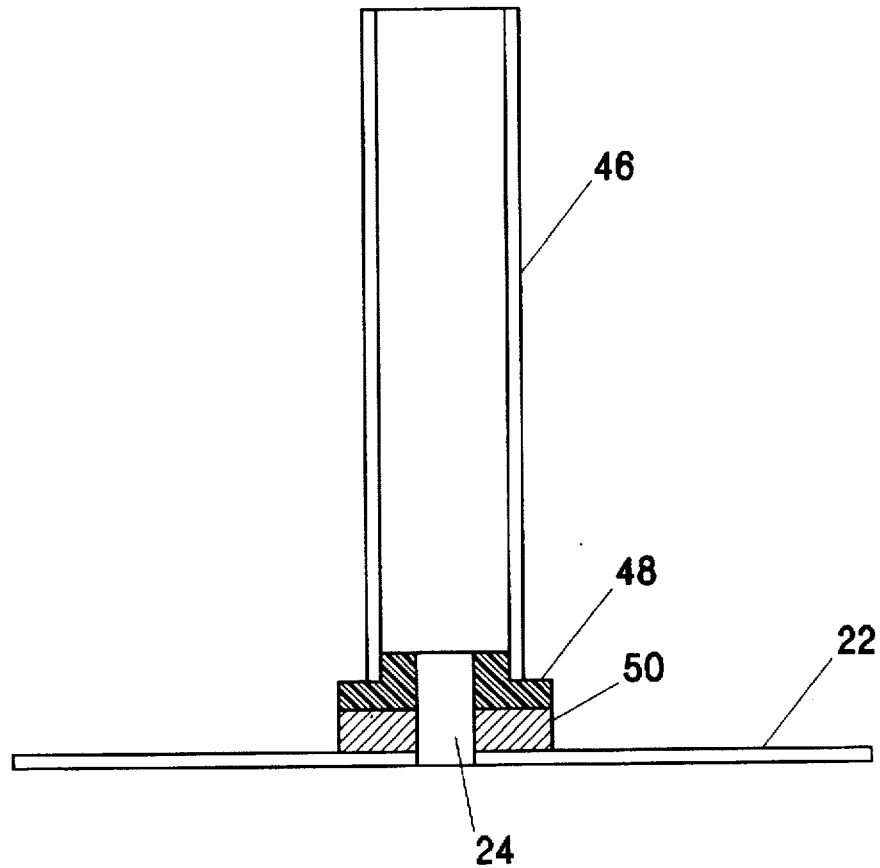
FIG. 5 is a cross section B—B FIG.4, showing a stencil plate bonded to the stencil holder.
Figure 6:
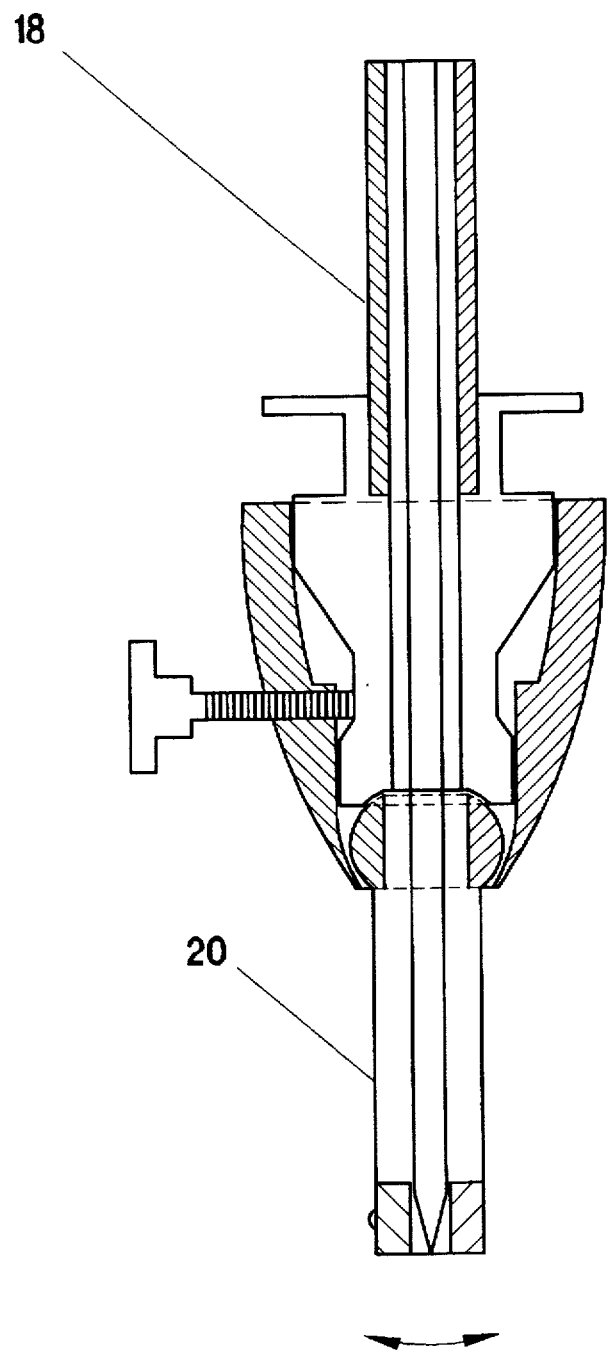
FIG. 6 is a cross section of the ball-joint mechanism. The angular pivoting action of the joint is indicated by the arrows. The ball joint technology is publicly available and thereof or not further described.

The stencil holder 16 in FIGS. 4 and 5 consists of a shaft 46 whose inside diameter allows it to be slipped over the printer head shaft 20. A step washer 48 is attached to the shaft 46 to provide support and bonding surface for a dense foam type resilient conforming pad 50. The exact composition of the conforming pad 50 is incidental to its design function. The stencil plate 22 is bonded with adhesive to the conforming pad 50, thus completing a stencil holder 16. The stencil plate material and surface mount technology pad footprint specifications are publicly available and therefore not further described. The centrally located aperture 24 in the stencil plate 22, as well as in the conforming pad 50 and step washer 48 is a key design element allowing passage of the lifting rod 26, FIG. 3.

Preferred Embodiment—Operation

The stencil holder 16 is slipped over the printer head shaft 20 and is held under light friction from the ball clip 32. With the stencil holder 16 in place, manual horizontal plane alignment of the stencil over the substrate pads is provided by rotation of the pivot arm 34 about the vertical pivot post 14 and rotation of the parallel arms system 36, the hinge piece 30 about the hinge pin 38. Angular alignment of the stencil holder 16 is provided by loosening the ball joint locking screw 42 and pivoting the printer head shaft 20 so that the stencil plate 22 conforms to the board surface. Once aligned the shaft is held in place by tightening the locking screw 42 so that the ball joint does not allow the shaft to rotate. Rotation of the stencil holder 16 about the printer head shaft 20 axis allows exact alignment of the stencil over the substrate pads. The tension spring 40 integrated in the parallel arm system provides downward force at the printer head 12, along the printer head shaft 20, along the stencil holder 16 and resulting in the stencil plate 22 being held firmly against the substrate surface.

With the stencil holder 16 now aligned and held in place, solder paste is applied over the stencil apertures and squeegeed to the level of the stencil plate 22 surface. The methods for paste dispensing and squeegeeing vary and are of individual preference and therefore not further described. The controlled lifting of the stencil holder 16 from the substrate is accomplished by depressing the cable release 44.

Referring to FIGS. 1 & 3, when the cable release unit 44 is depressed, the lifting rod 26 located and centrally guided in the printer head 12 and shaft 46 is forced downward to the position shown in the dashed outline. The activated lifting rod 26 passes through the aperture 24, FIG. 5 in the stencil holder 16. The tip of the lifting rod 26 contacts the substrate surface and, unable to continue downward, forces the entire printer head assembly 12, 20 and attached stencil holder 16 upward and clear of the substrate surface. The results of the described action is the application of solder paste to single component substrate pads that is accurately located and of consistent quantity and shape.

Conclusions, Ramifications, and Scope

Accordingly, it can be seen that the ball joint addition to the stencil printer adds to the ease and flexibility for adjusting the stencil to an angled surface. Further, the ball joint addition allows the user greater flexibility when using the printer.

Although the description above contains many specificities, these should not be construed as limiting the scope of the invention but as merely providing illustrations of some of the presently preferred embodiments of this invention. Various other embodiments and ramifications are possible within it's scope. For example, the printer can now be used on many boards that it could not be used with previously due to the restrictive conformity with angled surfaces.

Thus the scope of the invention should be determined by the appended claims and their legal equivalents, rather than by the examples given.

What is claimed is:

1. A solder paste stencil printer comprising;

a working base plate;

a pivot post;

a pivot arm mounted on said pivot post for horizontal plane motion;

a parallel arm system;

a hinge piece connecting said parallel arm system to said pivot arm;

said parallel arm system being downwardly spring biased for vertical plane motion;

and a printing head consisting of;

a main body, a ball joint, a mounting shaft, a friction ball clip for securing said stencil holder to said mounting shaft, a lifting rod passing through said main body and said mounting shaft, and a cable plunger mechanism for operating said lifting rod.

2. A solder paste stencil printer according to claim 1 further comprising:

a stencil plate mounted on said stencil holder;

said stencil holder comprising;

a shaft for fitting over said mounting shaft of said printer head, a step washer having a center aperture for passage of said lifting rod, and a resilient conforming pad having a center aperture for passage of said lifting rod.

3. A solder paste stencil printer according to claim 2 wherein said stencil plate comprises:

a plurality of apertures conforming to a footprint pattern;

and a centrally located aperture within said plurality of aperture for passage of said lifting rod.

* * * * *